United States Patent [19]

Hong

[11] Patent Number: 5,504,023
[45] Date of Patent: Apr. 2, 1996

[54] METHOD FOR FABRICATING SEMICONDUCTOR DEVICES WITH LOCALIZED POCKET IMPLANTATION

[75] Inventor: Gary Hong, Hsinchu, Taiwan

[73] Assignee: United Microelectronics Corp., Hsinchu, Taiwan

[21] Appl. No.: 379,881

[22] Filed: Jan. 27, 1995

[51] Int. Cl.⁶ ............................................. H01L 21/8232
[52] U.S. Cl. ............................................. 437/44; 437/953
[58] Field of Search ............................... 437/41, 44, 909, 437/41 CS, 953

[56] References Cited

U.S. PATENT DOCUMENTS

| | | | |
|---|---|---|---|
| 5,264,076 | 11/1993 | Cuthbert et al. | 156/657 |
| 5,328,862 | 7/1994 | Goo | 437/41 |
| 5,358,879 | 10/1994 | Brady et al. | 437/44 |
| 5,389,557 | 2/1995 | Jung-Suk | 437/44 |

FOREIGN PATENT DOCUMENTS

0433368A1  12/1990  European Pat. Off. ............... 437/44

OTHER PUBLICATIONS

Ghandhi, "VLSI Fabrication Principles Silicon and Gallium Arsenide", pp. 348–352, 1983.

Primary Examiner—George Fourson
Assistant Examiner—Richard A. Booth
Attorney, Agent, or Firm—Ladas & Parry

[57] ABSTRACT

A method for fabricating semiconductor devices with localized pocket implantation wherein narrow gaps between a masking layer and a gate electrode are formed prior to pocket implantation. The narrow gaps are formed by removing an isolation layer between the masking layer and the gate electrode. The localized pocket implantation forms small localized pocket regions in a substrate to minimize the areas of source-substrate and drain-substrate junctions, thus reducing the junction capacitance.

11 Claims, 3 Drawing Sheets

METHOD FOR FABRICATING SEMICONDUCTOR DEVICES WITH LOCALIZED POCKET IMPLANTATION

BACKGROUND OF THE INVENTION

1. Field of the Invention

The invention relates to fabricating of small geometry semiconductor devices, and more specifically to a method for fabricating semiconductor devices with localized packet implantation.

2. Prior Art

A submicron semiconductor integrated circuit is characterized by small and compact device dimensions. As the size of a semiconductor device is scaled down, the probability of reducing its reliability increases. The main factors that affect the reliability of the small geometry semiconductor device result from the shrinkage of its channel length and width. Therefore, an important issue in submicron device engineering is how to overcome the problems associated with short and narrow channel effects.

The hot carrier effect results from reducing the channel length in a small semiconductor device, which results in oxide charging and other problems that degrade the device. A submicron device with lightly-doped drain (LDD) structure has been used to improve its immunity to the hot carrier effect. However, the LDD structure may cause extension of depletion regions of the source and drain into the substrate region under the gate. This extension of the depletion regions tends to increase the probability of the punchthrough effect limiting the normal operation range of the semiconductor device.

A variety of solutions have been attempted to overcome the hot carrier effect as well as the punchthrough problem. For example, the punchthrough resistance can be improved by adding an ion implantation before or after the LDD formation thus increasing the substrate dopant concentration near the source and drain region. For two regions with opposite conductivity types, the width of their junction depletion region is reduced as the dopant concentrations increase. Therefore the additional implantation of dopant of the substrate conductivity type under the source and drain regions will narrow the width of the depletion regions of the source-substrate and drain-substrate junctions. In order to clarify the structure of the afore-mentioned device and its process flow, an exemplary embodiment is now described with reference to FIG. 1A through FIG. 1C.

The structure is prepared in a silicon substrate of, for example, P-type conductivity. Referring to FIG. 1A, after forming sequentially a silicon dioxide layer 12 and a polysilicon layer overlying silicon substrate 11, a gate electrode 14 of the device is formed by patterning and etching back the polysilicon layer. Therefore, due to the masking effect of gate electrode 14, a P-type implant to silicon substrate 11 forms deep lightly doped regions 17 adjacent to the channel region that is located below gate electrode 14 in substrate 11. P-type regions 17 which are also called pocket regions and have dopant concentrations higher than that in substrate 11.

After the formation of pocket regions 17, lightly doped source and drain regions 15 are formed by an N-type implant into substrate 11, as shown in FIG. 1B. N-type doped regions 15 have a shallow junction depth and have higher dopant concentrations than those of pocket regions 17.

The process is continued by forming spacers 18 around gate electrode 14. Referring to FIG. 1C, another N-type implant is performed to form heavily doped regions 19 in substrate 11. The process may be followed by forming passivation layers above the structure and contact metallization to interconnect the device and other circuitry (not shown in the drawings).

The LDD device fabricated according to the process flow described above has the advantage of suppressing both the hot carrier effect and the punchthrough problem. However, since P-type pocket regions 17 surround the entire N-type source and drain regions 19 in silicon substrate 11, the areas of source-substrate and drain-substrate junctions are so broad that relatively large junction capacitances cannot be eliminated. The larger the junction capacitances, the slower the switching speed of the device, thereby affecting the performance of the circuitry in which this device is utilized.

SUMMARY OF THE INVENTION

Accordingly, it is an object of the present invention to provide a method for fabricating semiconductor devices with localized pocket implantation to minimize the areas of source-substrate and drain-substrate junctions, thus decreasing junction capacitance.

Another object of the invention is to provide a method for fabricating semiconductor devices with localized pocket implantation to increase the performance of the circuitry.

These and other objects and advantages are achieved through a process in which narrow gaps between a masking layer and a gate electrode are formed prior to the pocket implantation. The narrow gaps are formed by removing an isolation layer between the masking layer and the gate electrode. In one embodiment of the invention, a dielectric layer and a gate electrode are subsequently formed upon a silicon substrate. An isolation layer is deposited to overlay the structure. A masking layer is formed upon the structure to expose only the top region of the gate electrode. After removing the isolation layer, gaps are formed around the gate electrode. An ion implantation is performed to form localized pocket regions in the silicon substrate. The process is continued by removing the masking layer and then implanting ions to form source and drain regions in the substrate.

DETAILED DESCRIPTION OF PREFERRED EMBODIMENTS

Figure 1A:
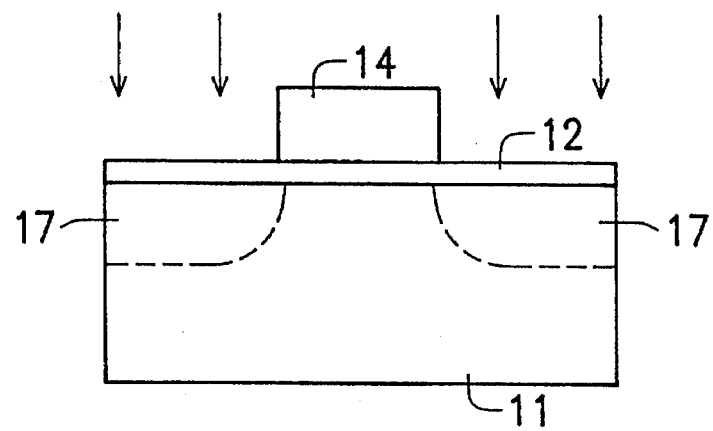
FIGS. 1A through 1C illustrate, in cross section, the process steps according to the prior art.
Figure 1B:
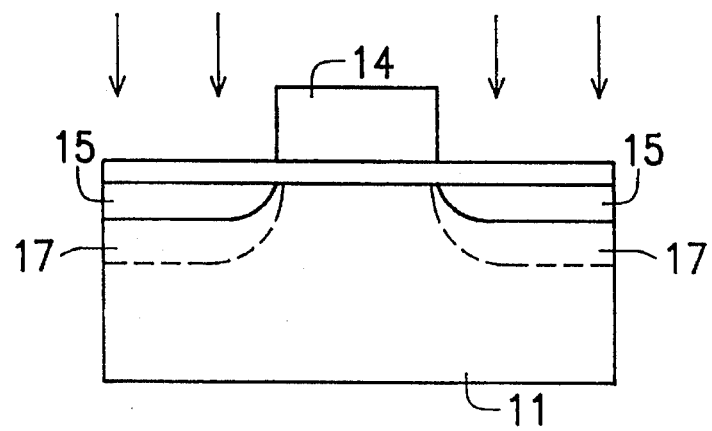
Figure 1C:
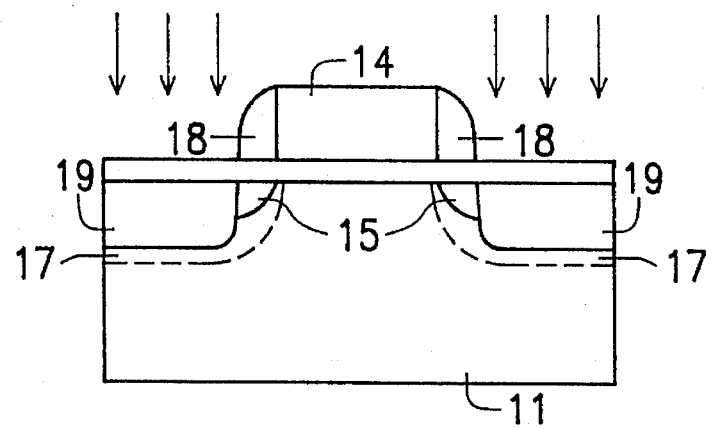

FIGS. 2A through 2F illustrate, in cross section, process steps in accordance with a preferred embodiment of the invention wherein localized pocket implantation is performed in the fabrication of a LDD device.

The preferred embodiment is processed in a silicon substrate 21 of P-type conductivity. After the formation of an isolation layer, such as a field oxide layer (not shown in the drawing), to define an active region upon silicon substrate 21, a dielectric layer 22, such as silicon dioxide layer 22, is formed upon the active region. Oxide layer 22 preferably has a thickness of approximately 100 to 200 Å. A polysilicon layer is deposited by, for example, chemical vapor deposition (CVD), overlying oxide layer 22. By subsequently performing a photolithography step and an etching step on the polysilicon layer, a polysilicon gate electrode 24 is defined on dielectric layer 22, which gate electrode in turn defines a channel region in silicon substrate 21. An isolation layer 26 is formed upon and around polysilicon gate electrode 24. Isolation layer 26 may be provided by a layer of silicon nitride, preferably deposited by CVD to a thickness of within a range of 500–2000 Å.

Figure 2A:
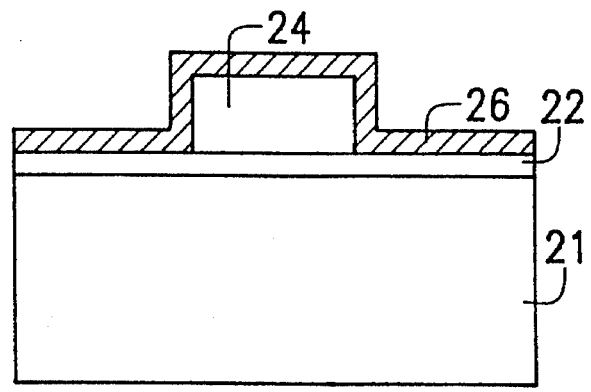
FIGS. 2A through 2E illustrate, in cross section, the process steps in accordance with a preferred embodiment of the present invention.
Figure 2B:
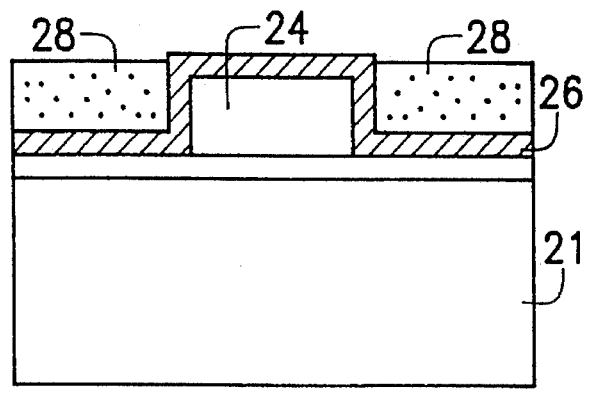

A masking layer, which is made of liquefiable material, such as photoresist or spin-on-glass (SOG) product, is formed upon the active region. The masking layer is processed by spinning or heating to planarize it, and polysilicon gate electrode 24 is completely submerged therein. After being cured and hardened, the masking layer is etched back to expose the portion of isolation layer 26 covering the top surface of gate electrode 24, as is shown in FIG. 2B. The top surface of the remaining masking layer 28 is preferably as high as that of gate electrode 24, and is isolated or spaced from gate electrode 24 by isolation layer 26.

Figure 2C:
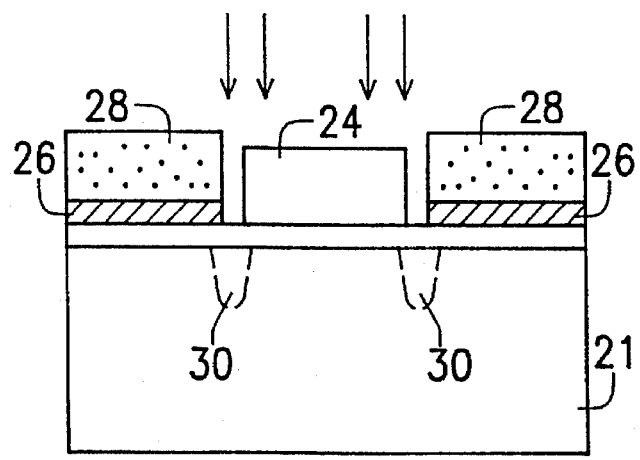

Next referring to FIG. 2C, the exposed portion of isolation layer 26 is etched, for example, by dry etching (or wet etching), and gaps are formed between masking layer 28 and gate electrode 24. The width of the gaps is rather narrow as they are equal to the thickness of isolation layer 26. Then an ion implantation step is performed to form P-type localized pocket regions 30 in silicon substrate 21. The localized pocket implantation is carried out by, for example, implanting boron ions at an implanting energy of about 50 KeV and a dosage within the range of $1E13$–$1E14/cm^2$ through the gaps into silicon substrate 21.

Figure 2D:
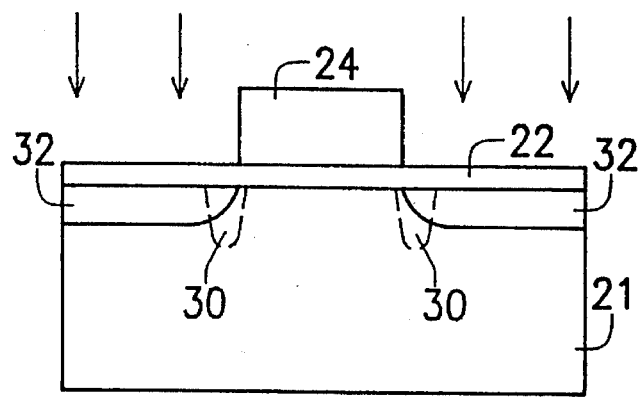

After removing masking layer 28 and isolation layer 26 from the surface of dielectric layer 22, referring to FIG. 2D, another ion implantation step is executed. Now an N-type ion implantation is carried out by implanting, for example, phosphorus ions at an implanting energy of about 50KeV and a dosage of about $1E13/cm^2$ to form lightly-doped regions 32 in silicon substrate 21. Lightly-doped regions 32 are parts of the source and drain regions of the device.

Figure 2E:
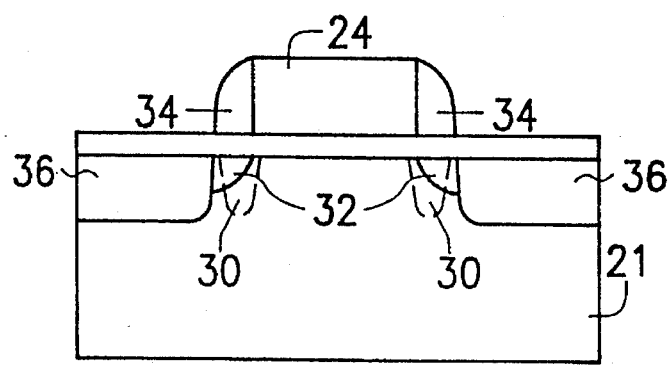

Further referring to FIG. 2E, another dielectric layer, such as silicon dioxide, polysilicon or silicon nitride, is deposited overlying the structure of FIG. 2D, and etched back to form sidewall spacers 34 around gate electrode 24. Then heavily doped regions 36 are formed by implanting N-type ions into silicon substrate 21. This ion implantation forms N-type heavily doped regions 36, i.e., the source and drain regions of the device, and can be carried out by implanting arsenic ions at an implanting energy of about 50KeV and a dosage of about $2E15/cm^2$.

The process for fabricating an LDD transistor of a second conductivity type on a silicon substrate of a first conductivity type is explained above. For example, the final structure in FIG. 2E is an N-type LDD transistor with P-type localized pocket regions on a P-type silicon substrate. The process stated above may also be applied to fabricate a P-type LDD transistor. The P-type device structure, which has N-type localized pocket regions 45 and P-type source/drain regions 42 and 46 in an N-type silicon substrate 41, as shown in FIG. 3, is similar to that of FIG. 2E, and can be manufactured by the process described above with reference to FIGS. 2A–2E by making appropriate changes to conductivity-types of the implanted ions.

Figure 3:
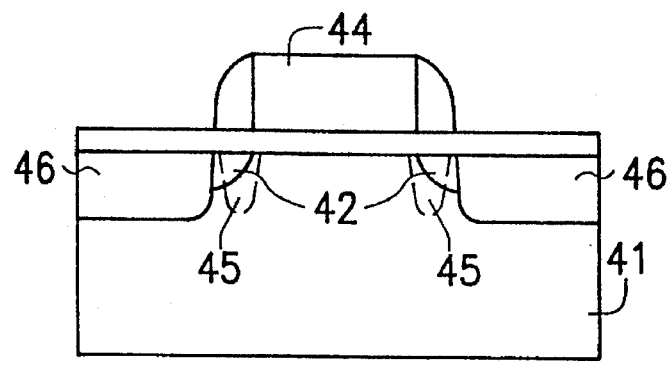
FIG. 3 illustrates, in cross section, an alternative device structure according to the invention.

The LDD devices shown in FIG. 2E and FIG. 3 have only small localized pocket regions at the two ends of their channels, therefore, the coupling regions of those pocket regions and drain/source regions are so limited that junction capacitance is greatly reduced. On the other hand, the localized pocket regions retain the advantage of narrowing depletion regions between the source/drain and substrate regions, thus preventing the punchthrough effect.

What is claimed is:

1. A method for fabricating a semiconductor device on a silicon substrate of a first conductivity type, comprising the steps of:

forming a dielectric layer overlying an active region;

forming a gate electrode upon said dielectric layer, thereby defining a channel region in said substrate;

forming an isolation layer upon and adjacent said gate electrode;

forming a masking layer disposed adjacent to the isolation layer around said gate;

removing exposed portions of said isolation layer to form gaps around said gate electrode;

implanting ions of the first conductivity type to form localized pocket regions in said substrate;

removing said masking layer;

implanting ions of a second conductivity type into said substrate to form lightly doped source/drain regions adjacent both ends of said channel region;

forming spacers on sidewalls of said gate electrode after having formed both the localized pocket regions and the lightly doped source/drain regions; and implanting ions of the second conductivity type into said substrate to form heavily doped source/drain regions.

2. The method as claimed in claim 1, wherein said gate electrode comprises polysilicon.

3. The method as claimed in claim 2, wherein said isolating layer consists essentially of silicon nitride.

4. The method as claimed in claim 3, wherein said isolating layer has a thickness of about 500 to 2000 Å.

5. The method as claimed in claim 1, wherein said masking layer is a layer of photoresist.

6. The method as claimed in claim 1, wherein said masking layer is a layer of spin-on-glass.

7. The method as claimed in claim 1, wherein said spacers consist essentially of silicon dioxide.

8. The method as claimed in claim 1, wherein said spacers consist essentially of polysilicon.

9. The method as claimed in claim 1, wherein said spacers consist essentially of silicon nitride.

10. The method of claim 1, wherein said first conductive type is N type and said second conductive type is P type.

11. The method of claim 1, wherein said first conductive type is P type and said second conductive type is N type.

* * * * *